United States Patent [19]

Frommeld et al.

[11] Patent Number: 5,085,669

[45] Date of Patent: Feb. 4, 1992

[54] PROCESS FOR STABILIZING A LEUCO-DYE SOLUTION BY MEANS OF A PIPERIDINE DERIVATIVE

[75] Inventors: Hans-Dieter Frommeld, Wiesbaden; Hartmut Wiezer, Eppstein, both of Fed. Rep. of Germany

[73] Assignee: Hoechst Aktiengesellschaft, Frankfurt am Main, Fed. Rep. of Germany

[21] Appl. No.: 418,335

[22] Filed: Oct. 6, 1989

[30] Foreign Application Priority Data

Oct. 8, 1988 [DE] Fed. Rep. of Germany ....... 3834299

[51] Int. Cl.⁵ .................. C09B 67/18; C07D 211/46; C07D 211/94; C07D 221/20
[52] U.S. Cl. ............................... 8/568; 544/198; 546/16; 546/19; 546/184; 546/188
[58] Field of Search .............. 430/338, 337, 340, 343, 430/917, 920; 546/184, 196; 8/568

[56] References Cited

U.S. PATENT DOCUMENTS

| | | | |
|---|---|---|---|
| 3,042,575 | 7/1962 | Hartler | 162/80 |
| 4,271,251 | 6/1981 | Aotanz et al. | 430/195 |
| 4,423,139 | 12/1983 | Isbrandt et al. | 430/338 |
| 4,632,897 | 12/1986 | Barzynski et al. | 430/260 |
| 4,780,393 | 10/1988 | Frommeld | 430/292 |
| 4,940,647 | 7/1990 | Frommeld et al. | 430/271 |

FOREIGN PATENT DOCUMENTS

| | | | |
|---|---|---|---|
| 3534527 | 4/1986 | Fed. Rep. of Germany | 430/260 |
| 3735088 | 4/1989 | Fed. Rep. of Germany | 430/260 |

OTHER PUBLICATIONS

Haubold et al., Chemical Abstracts, vol. 110, #31445t (1989).
Mayer et al., Chemical Abstracts, vol. 88, #192099a (1978).
Wiezer, Chemical Abstracts, vol. 96, #86493e (1982).

*Primary Examiner*—Mary C. Lee
*Assistant Examiner*—Fiona T. Powers
*Attorney, Agent, or Firm*—Foley & Lardner

[57] ABSTRACT

The invention describes a process for stabilizing a leuco-dye solution in an organic solvent against oxidation in air. In the process, a compound containing at least one 2,2,6,6-tetraalkylpiperidine, 2,2-dialkylpiperidine-6-spiro-cycloalkane or piperidine-2,6-dispirocycloalkane grouping is added to the solution. The process is, in particular, used for stabilizing photoresist solutions which, apart from the leuco dye, contain polymerizable compounds and photoinitiators, especially radiation-sensitive trihalomethyl compounds.

14 Claims, No Drawings

PROCESS FOR STABILIZING A LEUCO-DYE SOLUTION BY MEANS OF A PIPERIDINE DERIVATIVE

BACKGROUND OF THE INVENTION

The invention relates to a process for stabilizing a solution of a leuco dye in an organic solvent, to the correspondingly stabilized solution and to a radiation-polymerizable mixture containing a polymeric binder, a polymerizable compound, a radiation-activatable polymerization initiator and a leuco dye.

Mixtures of the above-indicated composition are known in the art. The addition of a leuco dye has the effect that, after exposure, the mixture exhibits a visible contrast between exposed and unexposed areas, since leuco dyes are oxidized during or after exposure to form the corresponding dyes. Mixtures of this kind are described, for example in DE-A 31 31 448 and in EP-A 230 941.

Due to the fact that leuco dyes are slowly oxidized even in the dark, these mixtures tend to discolor, i.e., they gradually assume a blueish shade, even during storage in the dark. This tendency is increased when photooxidizing agents, for example, trihalomethyl compounds which split off halogen radicals upon exposure, are added to obtain an intensification of contrast. A number of stabilizers, for example, sulfur compounds, phenols and other reducing agents have therefore been recommended for photopolymerizable mixtures and materials of this kind.

DE-A 35 34 527 describes thiuramdisulfide for use as a stabilizer. Similarly to thiourea, thiuramdisulfide is a moderate stabilizing agent. These compounds have the disadvantage of reacting with copper surfaces, which gives rise to annealing tints, staining upon developing and problems in a subsequent electro-plating process. In addition, photosensitivity is reduced by thiuramdisulfides.

U.S. Pat. No. 3,042,575 mentions stabilizers comprising phenols, such as resorcinol or hydroquinone. In most cases, however, the effect of these compounds is inadequate.

DE-A 29 41 846 describes 2,4-dihydroxybenzaldoxime as a reducing stabilizer, which has a better stabilizing action. But even when this compound is added, shelf life is still insufficient and, in addition, the adhesion of the layer to copper is impaired.

DE-A 37 35 088 describes stabilization of mixtures of this kind by the addition of an epoxy compound. This addition is very effective and prevents discoloration of the components of the solid photopolymerizable layer, even upon prolonged storage.

It has now been found that oxidation of a leuco dye and, consequently, discoloration of a mixture which has been stabilized as described above still occurs, when the mixture is kept for a certain period in the form of a solution in an organic vent—which is often inevitable prior to the coating of a support. A particularly serious discoloration of the coating solution in the absence of light occurs in those cases in which the solution contains a halomethyl compound. This discoloration is, however, observed in leuco-dye solutions in general, i.e. even in solutions which only contain the leuco dye and no further dissolved components.

SUMMARY OF THE INVENTION

Accordingly, it is an object of the present invention to provide a process for stabilizing leuco dyes in organic solvents against oxidation.

Another object of the present invention is to provide a radiation-polymerizable mixture comprising polymerizable compounds and radiation-activatable polymerization initiators, in particular compounds with dihalomethylene or trihalomethyl groups, and a leuco dye, which can be processed by coating from a solution without showing any substantial discoloration upon standing in solution.

In accomplishing the foregoing objects, there has been provided, in accordance with one aspect of the present invention, a process for stabilizing a leuco dye solution in an organic solvent against oxidation in air, comprising the step of adding to the solution a compound which comprises at least one 2,2,6,6-tetraalkylpiperidine, 2,2-dialkylpiperidine-6-spiro-cycloalkane or piperidine-2,6-dispirocycloalkane grouping.

In accordance with another aspect of the present invention, there is provided a solution of a leuco dye in an organic solvent, comprising a compound as described above.

In accordance with still another aspect of the present invention, there is provided a radiation-polymerizable mixture comprising a polymerizable compound having at least one terminal ethylenic double bond and a boiling point above 100° C. under normal pressure, a compound which, under the action of actinic radiation, is capable of initiating the polymerization of the unsaturated compound, a leuco dye, and a compound as described above.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The piperidine derivatives which are used as stabilizers in the present invention are known as "Hals"-products. Suitable compounds are described, for example, in "Angewandte Makromolekulare Chemie" [Applied Macromolecular Chemistry], No. 158/159 (1988), pages 284–285, in EP-A 42 554 and in DE-A 26 34 957 and DE-A 36 41 014.

It is an essential structural feature of these compounds that they contain a group of the formula

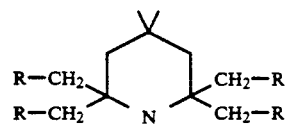

in which all R may be the same or different and denote hydrogen atoms or alkyl groups of 1 to 10 carbon atoms. Two adjacent alkyl groups R may, in each case, be linked to form a cycloaliphatic ring. Compounds in which R is H are, in general, preferred.

A hydrogen atom or an unsubstituted or substituted alkyl or alkylene group which may be interrupted by ether oxygen atoms, carbonyl groups or ester groups is attached to the nitrogen atom of the piperidine ring. If an alkylene group is present, the latter is bonded by its free valence to a further, substituted piperidine group of the above-indicated formula, preferably in the 4-position, such that polymeric compounds may be formed.

The piperidine ring may have one or two substituents in the 4-position, which may be linked to one another to form an isocyclic or heterocyclic ring which forms a spirane structure together with the piperidine ring. One substituent in the 4-position is preferably linked to the ring by an oxygen or nitrogen atom. The substituent in the 4-position may also be an oligomer or polymer chain carrying at least two piperidine rings.

A polymeric piperidine compound may contain up to about 30 piperidine groupings in its molecule.

The solutions or mixtures of the present invention generally contain from about 0.1 to 150% by weight, preferably from 2 to 50% by weight, of piperidine derivative, based on the quantity of leuco dye.

The piperidine derivatives are successfully added to solutions of leuco dyes in all cases, in which the leuco dyes are to be kept in solution for a relatively long period of time and are to be protected from oxidation. Stabilization is particularly effective if the solution additionally contains photosensitive organic halogen compounds, in particular, compounds having dihalomethylene or trihalomethyl groups, such as dichloromethylene, dibromomethylene or tribromomethyl groups, especially trichloromethyl groups. The stabilization process according to the present invention is primarily used in connection with photopolymerizable mixtures containing leuco dyes as substances which change color upon exposure. In general, the mixtures contain from about 0.1 to 8% by weight, preferably from 0.3 to 5% by weight, of leuco dye, based on their non-volatile constituents.

Preferred leuco dyes are those of the triphenylmethane or xanthene series. Examples of these are the leuco bases of crystal violet, Victoria Blue BH, Victoria Pure Blue BOH, methyl violet, fuchsin, malachite green, Acid Violet 5B, Solar Cyanine 6B, brilliant green and Acilane Violet S. Particularly preferred are tris-(p-dimethyl-aminophenyl)methane,tris-(p-diethylaminophenyl) methane, tris-(2-methyl-4-diethyl-amino-phenyl) methane, tris-(p-dipropyl-amino- phenyl)methane and 3,6-bis-diethylamino- 9-phenyl-xanthene.

Apart from the piperidine derivatives, the photopolymerizable mixtures of the present invention may contain epoxy compounds as additional stabilizers, as described, for example, in DE-A 37 35 088.

The epoxy compounds should be non-volatile or practically non-volatile. The molecular weight of the epoxy compounds, however, preferably should not be higher than 600, in particular no higher than 400.

Suitable compounds are, for example, glycidyl ethers of aliphatic and aromatic compounds, for example, the mono- or diglycidyl ether of 2,2-bis-(4-hydroxyphenyl)-propane, phenyl glycidyl ether, tert.-butylphenyl glycidyl ether, p-methoxyphenyl glycidyl ether, 2-ethylhexyl glycidyl ether or the styrene oxide. Preference is given to monoepoxides and also to compounds having at least one aromatic ring in their molecule, e.g. aryl glycidyl ethers. The epoxides are preferably added in quantities of about 0.05 to 2% by weight, based on the non-volatile constituents of the mixture.

Photoinitiators which may be used include benzophenone, Michler's ketone, thioxanthone,p-dialkylaminobenzoic acid ester, 2,4,5-triarylimidazolyl dimers, and heterocyclic compounds having 2 to 5 aromatic rings and at least one nitrogen atom as the hetero atom, in particular acridine, phenazine and quinoline derivatives.

Compounds which may be mentioned include: 2,2'-bis(o-chlorophenyl)-4,4',5,5'-tetraphenylbiimidazole, 9-(4'-tolyl)-acridine, 9-(4'-methoxyphenyl)-acrindine, 9-(4'-hydroxy-phenyl)-acridine, 9-acetylamino acridine, 9,10-dimethyl-benz[a]-phenazine, 10-methyl-benz[a]-phenazine, 9-methoxybenz[a]phenazine, 10-methoxybenz[a]phenazine, dibenz[a,c]-phenazine, 11-methoxydibenz[a,c]phenazine, dibenz[a,j]-phenazine, in particular 9-phenylacridine, 9-(4'-t-utylphenyl)-acridine, benz-[a]phenazine, 9-methyl-benz[a]phenazine, 2-styrylquinoline, cinnamylidenequinaldine and 3-(o-chlorobenzylidene)-9-phenyl-2,3-dihydro-lH-c yclopenta[b-]quinoline.

The quantity of initiator generally ranges from about 0.01 to 10% by weight, preferably from 0.05 to 4% by weight, based on the non-volatile constituents of the mixture.

Preferably, the mixture contains a compound having at least one trihalomethyl substituent or a dihalogenated methylene group in its molecule, as the initiator or as coinitiator in combination with one of the above-indicated compounds.

Of these compounds tribromomethyl phenyl sulfone, 2,2-dibromomalonic diamide, $\alpha,\alpha$-dibromo-$\alpha$-cyanomethyl phenyl sulfone, $\alpha,\alpha$-dibromo-$\alpha$-benzoylmethyl phenyl sulfone, 2,2-dibromomalonic-bis-N-methylamide, 2,4,6-tris(trichloromethyl)-s-triazine, 4,6-bis(trichloromethyl)-s-triazines or 2-tribromomethylquinoline can, in particular, be used, of the 4,6-bis(trichloromethyl)-s-triazines the derivatives substituted in the 2-position are preferably employed. The preferred substituents are methyl-, ethyl-, phenyl-, 4-methoxyphenyl- or 4,'-styrylphenyl-. Tribromomethyl phenylsulfone is particularly preferred. The coinitiator is preferably used in a quantity of about 0.01 to 2% by weight.

Polymerizable compounds useful for the purposes of the invention are known and are described, for example, in U.S. Pat. No. 2,760,863 and U.S. Pat. No. 3,060,023.

Preferred examples are acrylic and methacrylic esters of monohydric or polyhydric, preferably at least dihydric, alcohols, such as ethylene glycol diacrylate, polyethylene glycol dimethacrylate, acrylates and methacrylates of trimethylol ethane, trimethylol propane, pentaerythritol and dipentaerythritol, and of polyhydric alicyclic alcohols or N-substituted acrylic and methacrylic amides. Reaction products of mono- or diisocyanates with partial esters of polyhydric alcohols are also used advantageously. Monomers of this kind are described in DE-A 20 64 079, DE-A 23 61 041 and DE-A 28 22 190. The proportion of monomers contained in the layer generally varies between about 10 and 80% by weight, preferably 20 to 60% by weight.

Preferably, the mixture additionally contains a polymeric binder. A large number of soluble organic polymers can be employed as binders. Examples are, polyamides, polyvinyl esters, polyvinyl acetals, polyvinyl ethers, epoxide resins, polyacrylic esters, polymethacrylic esters, polyesters, alkyd resins, polyacrylamide, polyvinyl alcohol, polyethylene oxide, polydimethylacrylamide, polyvinyl pyrrolidone, polyvinylmethylformamide, polyvinylmethylacetamide, and copolymers of the monomers which form the enumerated homopolymers.

With particular advantage, binders are used that are insoluble in water but that are soluble, or at least swellable in aqueous-alkaline solutions, since layers containing such binders can be developed with the preferably employed aqueous-alkaline developers. Binders of this type can, for instance, contain the following groups: $-COOH$, $-PO_3H_2$, $-SO_3H$, $-SO_2-NH-$, $SO_2-NH-SO_2-$, and $-SO_2-NH-CO-$.

Examples of these binders are: maleate resins, polymers of $\beta$-methacryloyloxy-ethyl-N-(p-tolylsulfonyl)-carbamate and copolymers of these and similar monomers with other monomers, vinyl acetate/crotonic acid copolymers and styrene/maleic anhydride copolymers. Copolymers of alkyl(meth)acrylates and methacrylic acid and copolymers of methacrylic acid, higher alkyl(meth)-acrylates and methyl methacrylate and/or styrene, acrylonitrile, and the like, which are described in DE-A 20 64 080 and DE-A 23 63 806, are preferably used.

In general, the quantity of binder added ranges from about 20 to 90% by weight, preferably from 40 to 80% by weight, of the layer constituents.

Depending on their intended use and desired properties, the photopolymerizable mixtures can contain various additional substances. Examples of these admixtures are:

Adhesion promoters, inhibitors to prevent thermal polymerization of the monomers, hydrogen donors, substances that modify the photosensitivity of layers of this type, dyes, colored and uncolored pigments, plasticizers, such as polyglycols or esters of p-hydroxy benzoic acid.

Suitable additional substances are, for example, sulfur compounds, such as mercaptobenzimidazole, mercaptobenzothiazole, imidazole or imidazole derivatives, compounds containing a trivalent phosphorus, such as triphenylphosphine or triphenylphosphite.

These constituents advantageously should be selected to minimize absorption in the region of actinic radiation, which is important for the initiation process.

The photopolymerizable mixture of the present invention can be used in various applications, such as in the production of varnishes which are hardened by the action of light and, in particular, in a light-sensitive recording material used in the field of reproduction. Examples of applications in this field are, recording layers for the photomechanical production of printing plates suitable for letterpress printing, lithographic printing, gravure printing, or screen printing, relief copies, for example, in the production of Braille books, single copies, tanned images, pigment images, etc. The mixtures of the present invention can also be employed for the photomechanical production of etch resists, for example, for name plates, printed circuits, and chemical milling. The mixtures of this invention are of particular importance with regard to the photoresist technology, in particular for use as dry photoresist materials.

The mixture within the present invention can be used industrially for the above-mentioned applications as a liquid solution or dispersion, for example, a photoresist solution, which is applied by the consumer to an individual support, for example, for chemical milling, for the production of printed circuits, screen printing stencils, etc. The mixture can also be present as a solid photosensitive layer coated on a suitable support, i.e., as a storable, presensitized photosensitive copying material, for example, for the production of printing plates. It can also be employed for the production of dry resists.

Layer supports which are suitable for recording materials prepared using the mixture of the present invention include, for example, aluminum, steel, zinc, copper, plastic films, such as films of polyethylene terephthalate or cellulose acetate, and screen printing supports, such as perlon gauze.

The radiation-sensitive or photosensitive materials employing the mixture of this invention are conventionally prepared.

The components are dissolved in an organic solvent and the resulting solution or dispersion is applied to the intended support as a film by casting, spraying, dipping, roller application etc. and is subsequently dried. The organic solvents are selected depending on the intended application. For the production of dry resists, low-boiling solvents are, in general, employed, i.e. solvents or solvent mixtures in which at least 90% of the components have boiling points below 100° C., for example, alcohols, ketones, esters, ethers and halogenated hydrocarbons, such as methylene chloride and trichloroethane, having up to 4 carbon atoms. Spray-coating, dip-coating and roller-coating are preferably carried out using solutions in medium to high-boiling solvents, i.e. solvents having boiling points in the range from about 120° to 250° C., for example, ethoxypropanol, methoxybutanol, butyrolactone, N-methylpyrrolidone or dimethylformamide and mixtures thereof.

The materials are processed using known methods. Images are produced by exposure to actinic radiation. Within the scope of the present description, actinic radiation refers to any radiation, the energy of which corresponds at least to that of short-wave visible light. Long-wave UV-radiation can, for example, be used and also laser radiation of wavelengths >400 nm. The materials are developed by treatment with an appropriate developer solution, for example, a solution of organic solvents, but preferably with a weakly alkaline aqueous solution, such that the unexposed areas of the layer are removed, while the exposed areas of the photopolymerizable layer remain on the support.

The following examples illustrate preferred embodiments of the present invention. Quantitative ratios and percentages are to be understood as weight units. The amounts of the individual constituents are expressed in parts by weight (pbw).

The accompanying list of formulae indicates structural formulae of piperidine compounds used as stabilizers in the examples.

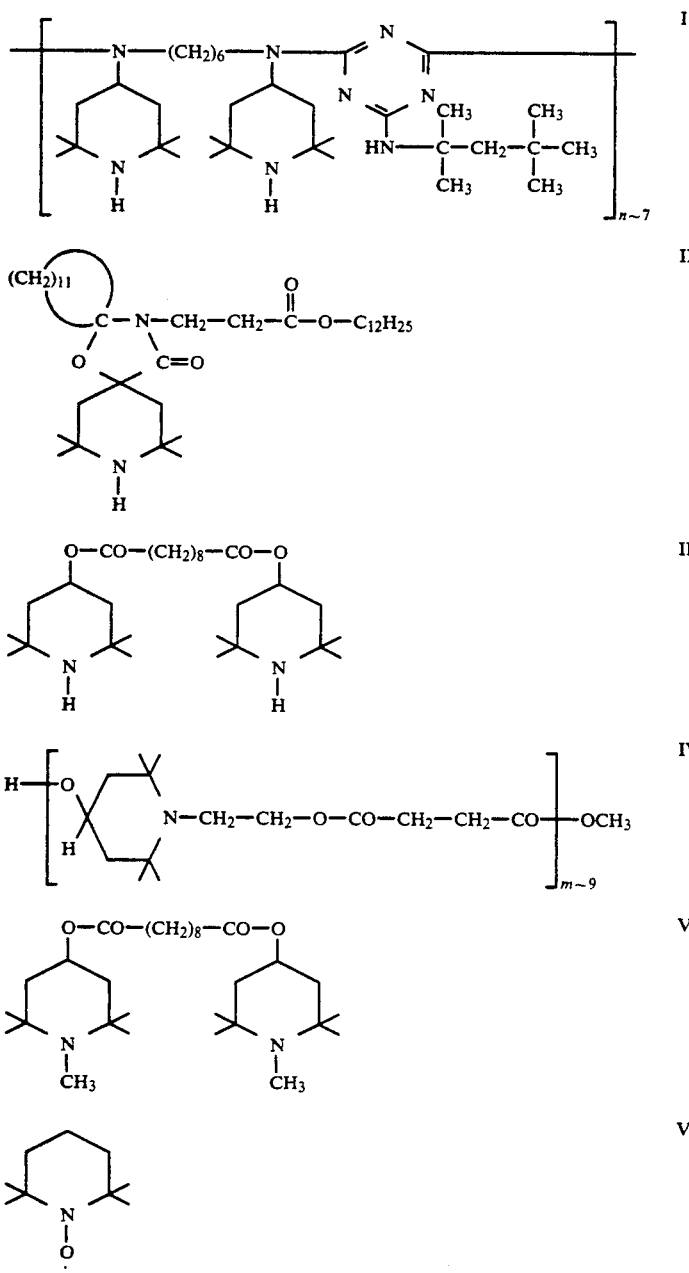

EXAMPLE 1

| In | 100 | pbw | of butanone |
|---|---|---|---|
|  | 1 | pbw | of leuco crystal violet was dissolved with the addition of |
| A | 0.05 | pbw | of compound I or |
| B | 0.05 | pbw | of compound II or |
| C | 0.05 | pbw | of compound III or |
| D | 0.05 | pbw | of di-(1,2,2,6,6-pentamethyl-4-piperidinyl)-butyl-(3',5'-di-tert.-butyl-4-hydroxybenzyl-malonate or |
| E |  |  | without addition. |

After standing for four hours, the initially colorless solutions were examined for their content of crystal violet in a calorimetric test. Solutions A to D were light violet and contained about 2 ppm of crystal violet, solution E was markedly darker and contained 10 ppm of crystal violet.

EXAMPLE 2

| In | 100 | pbw | of butanone |
|---|---|---|---|
|  | 1 | pbw | of leuco crystal violet and |
|  | 0.1 | pbw | of tribromomethyl phenyl sulfone were dissolved with the addition of |
| A | 0.1 | pbw | of compound I or |
| B | 0.1 | pbw | of compound II or |
| C | 0.1 | pbw | of compound III or |
| D |  |  | without addition. |

All solutions were initially colorless. After three hours, solutions A to C contained about 2 ppm of crystal violet, and solution D about 100 ppm of crystal violet.

EXAMPLE 3

An amount of 0.1 pbw each of one of the following substances:

| | |
|---|---|
| A | 2,2,6,6-tetramethylpiperidine, |
| B | 2,2,6,6-tetramethylpiperidone-(4), |
| C | compound of formula IV, |
| D | compound of formula V, |
| E | compound of formula III, |
| F | compound of formula I, |
| G | 2,2,6,6-tetramethylpiperidinoxy (free radical; formula VI), |
| H | t-butylphenyl glycidylether, |
| I | hydroquinone monomethyl ether, |
| K | 2,4-dihydroxybenzaldoxime, |
| L | salicylaldoxime, |
| M | no addition | was added to coating solutions comprising

| | | |
|---|---|---|
| 55 | pbw | of a terpolymer of styrene, n-hexylmethacrylate and methacrylic acid (10:60:30), having an acid number of 190, |
| 36 | pbw | of the reaction product obtained from 1 mole of 2,2,4-trimethylhexamethylene-diisocyanate and 2 moles of 2-hydroxyethylmethacrylate, |
| 39 | pbw | of the reaction product obtained from 1 mole of n-butylisocyanate and 1 mole of 2-hydroxyethylmethacrylate, |
| 2 | pbw | of leuco crystal violet, |
| 0.1 | pbw | of tribromomethyl-phenylsulfone |
| 0.35 | pbw | of 9-phenylacridine and |
| 0.035 | pbw | of Waxoline Blue (C.I. 61 551) in |
| 30 | pbw | of ethanol and |
| 150 | pbw | of butanone. |

After the solutions had stood in the dark for 40 hours at 23° C., a portion of each solution was applied to 25 μm thick polyethylene terephthalate film and dried for 2 minutes at 100° C. Dry resist layers having a layer weight of 42 g/m² were obtained, which were covered with polyethylene film (20 μm) to protect them from soiling.

With the aid of a Hunter Lab Color Tester the color values of the layers were measured. Layers A to F (L=77–80) were light, layers G to M (L<73) were dark (see also Table I).

In addition, a small portion of each solution was diluted with butanone in a ratio of 1:25. Solutions A to F were pale blue, solution H was blue with a violet tinge and solutions G and I to M were dark violet.

A Perkin-Elmer UV-spectrometer was used for a comparative measurement of the solutions in 1 cm bulbs, against a fresh solution. Solutions A to F showed no content of crystal violet, whereas solution H showed a noticeable content and solutions G and I to M exhibited an even higher content of crystal violet.

The second column in Table I indicates the absorption of the resist layers at 590 nm, which is substantially due to crystal violet.

The dilute solutions A to M were allowed to stand for another 8 hours in yellow light. After this treatment, solutions A to F were still very light, whereas comparative solutions G to M were all dark.

TABLE I

| Experiment | L-Value (Hunter-Lab) | Absorption 590 nm |
|---|---|---|
| A | 79.2 | 0.00 |
| B | 77.9 | 0.01 |
| C | 77.8 | 0.01 |
| D | 79.5 | 0.00 |
| E | 77.8 | 0.01 |
| F | 79.3 | 0.00 |
| G | 64.7 | 0.85 |
| H | 72.6 | 0.12 |
| I | 70.1 | 0.19 |
| K | 69.4 | 0.26 |
| L | 69.1 | 0.27 |
| M | 70.2 | 0.17 |

EXAMPLE 4

To produce a stabilizing effect

| | | |
|---|---|---|
| A | 1 pbw | of 2,2,6,6-tetramethylpiperidine or |
| B | 0.5 pbw | of 2,2,6,6-tetramethylpiperidine or |
| C | | nothing | was added to coating solutions comprising

| | | |
|---|---|---|
| 50 | pbw | of a copolymer of methyl methacrylate and methacrylic acid (acid number 115), |
| 50 | pbw | of trimethylolpropane triacrylate, |
| 1 | pbw | of 9-phenylacridine, |
| 1 | pbw | of leuco crystal violet, |
| 1 | pbw | of 2-methyl-4,6-bis-trichloromethyl-s-triazine and |
| 0.02 | pbw | of 1,4-bis-(4-tert.-butoxyphenylamino)-5,8-dihydroxyanthraquinone (Polysynthrene Green) in |
| 550 | pbw | of 2-methoxyethanol and |
| 120 | pbw | of butanone. |

The solutions were allowed to stand for 64 hours in closed vessels, in the dark at 22° C. Thereafter solution A was light green, solution 8 was light green with a blue tinge and solution C was deep violet.

Solutions A to C were then applied by spin-coating onto 0.3 mm thick aluminum which had been electrolytically grained and hardened by anodiation. The layers were dried for two minutes at 100° C., to produce a layer weight of 3 g/m².

Layer A was very light (L=51.0), layer B was slightly darker (L=46.5), and layer C was very dark (L=25.8).

The plates provided with the photosensitive layer were coated with a 15% strength aqueous solution of polyvinyl alcohol (12% residual acetyl groups, K value 4) and again dried to give a layer weight of 4 to 5 g/m².

The printing plates obtained in this manner were exposed for 10 seconds to the light of a 5 kw metal halide lamp arranged at a distance of 80 cm, under a negative original and a 13-step exposure wedge having density increments of 0.15. Printing plates A and B immediately showed a high-contrast positive image, while printing plate C did not give a comparable result. The areas of the photo-sensitive layer, which had not been hardened by light were removed by wiping over with a developer solution of the following composition,

| | | |
|---|---|---|
| 3 | pbw | of sodium metasilicate × 9 H$_2$O, |
| 0.05 | pbw | of strontium chloride, |
| 0.03 | pbw | of a non-ionic wetting agent (coconut fatty alcohol-polyoxyethylene ether containing approximately 8 oxyethylene units) and |
| 0.003 | pbw | of antifoam agent in |
| 100 | pbw | of fully demineralized water. |

The number of fully hardened steps of the exposure wedge showed that layer C (4 steps) was only half as photosensitive as layers A and B (both 6 steps).

EXAMPLE 5

| | | | |
|---|---|---|---|
| A | 0.1 | pbw | of 2,2,6,6-tetramethyl piperidine, |
| B | 1 | pbw | of 2,2,6,6-tetramethyl piperidine, |
| C | 0.05 | pbw | of 2,2,6,6-tetramethyl piperidine + |
| | 0.05 | pbw | phenyl glycidyl ether, |
| D | 0.1 | pbw | of di-(1,2,2,6,6-pentamethyl-4-piperidinyl)-2,2-di-(3,5-di-tert.-butyl-4-hydroxy-benzyl)-malonate, |
| E | 0.1 | pbw | of (1,2,2,6,6-pentamethyl-4-piperidinyl)-acrylate, |
| F | 0.1 | pbw | of phenyl glycidyl ether, |
| G | 0.1 | pbw | of 2,2,6,6-tetramethyl-piperidinoxy (free radical, compound VI) or |
| H | | | nothing | was added to solutions of

| | | |
|---|---|---|
| 50 | pbw | of a terpolymer of styrene, n-hexyl methacrylate and methacrylic acid (10:60:30) having an acid number of 190, |
| 25 | pbw | of the reaction product obtained from 1 mole of 2,2,6-trimethylhexamethylene diisocyanate and 2 moles of 2-hydroxyethyl methacrylate, |
| 25 | pbw | of the reaction product obtained from 1 moles of hydroxyethyl acrylate, 2 moles of caprolactone and 1 mole of n-butyl isocyanate, |
| 2.4 | pbw | of leuco malachite green, |
| 0.8 | pbw | of isopropylthioxanthone, |
| 2.0 | pbw | of ethyl-p-dimethylamino-benzoate, and |
| 0.15 | pbw | of 2-phenyl-4,6-bis-trichloro-methyl-s-triazine in |
| 80 | pbw | of butanone and |
| 80 | pbw | of ethanol |

The solutions were examined after one and after seven days and a portion of each solution was applied to polyester film and dried. Solutions A to E were still colorless and light after seven days, while solutions F to H, after only one day, showed a green coloration which intensified in the course of seven days. Accordingly, photosensitive films A to E were brilliantly light after one and after seven days, whereas films F to H were greenish and differed in brightness. Photoresists of invariable quality can thus only be prepared from solutions of type A to E.

What is claimed is:

1. A process for stabilizing a leuco-dye solution in an organic solvent against oxidation in air, comprising the step of adding to said solution a compound which comprises at least one 2,2,6,6-tetraalkylpiperidine, 2,2-dialkylpiperidine-6-spiro-cycloalkane or piperidine-2,6-dispiro-cycloalkane grouping.

2. The process as claimed in claim 1, wherein said compound carries a hydrogen atom or an unsubstituted or substituted alkyl group on its nitrogen atom.

3. The process as claimed in claim 1, wherein the piperidine ring of said compound, in the 4-position, is linked to an oxygen or nitrogen atom of a substituent.

4. The process as claimed in claim 1, wherein said compound contains from 1 to about 30 substituted piperidine groupings in its molecule.

5. A solution of a leuco dye in an organic solvent which comprises a compound having at least one 2,2,6,6-tetraalkylpiperidine, 2,2-dialkylpiperidine-6-spiro-cycloalkane or piperidine-2, 6-dispiro-cycloalkane grouping.

6. The solution as claimed in claim 5, wherein said compound carries a hydrogen atom or an unsubstituted or substituted alkyl group on its nitrogen atom.

7. The solution as claimed in claim 5, wherein the piperidine ring of the said compound is linked, in the 4-position, to an oxygen or nitrogen atom of a substituent.

8. The solution as claimed in claim 5, wherein said compound contains from 1 to about 30 substituted piperidine groupings in its molecule.

9. The solution as claimed in claim 5, wherein the organic solvent is an alcohol, ketone, ester, ether or halogenated hydrocarbon or a mixture thereof.

10. The solution as claimed in claim 5, wherein at least 90% of the components of the solvent have a boiling point below 100° C.

11. The solution as claimed in claim 5, wherein the leuco dye is a triphenylmethane or xanthen dye.

12. The solution as claimed in claim 5, further comprising a radiation-sensitive trihalomethyl compound.

13. The solution as claimed in claim 5, which comprises from about 0.1 to 150 parts by weight of piperidine compound per 100 parts by weight of leuco dye.

14. The solution as claimed in claim 5, further comprising an epoxy compound as a stabilizer for the leuco dye.

* * * * *